US006876009B2

(12) United States Patent
Narukawa et al.

(10) Patent No.: US 6,876,009 B2
(45) Date of Patent: Apr. 5, 2005

(54) NITRIDE SEMICONDUCTOR DEVICE AND A PROCESS OF MANUFACTURING THE SAME

(75) Inventors: Yukio Narukawa, Anan (JP); Isamu Niki, Anan (JP); Axel Scherer, Pasadena, CA (US); Koichi Okamoto, Pasadena, CA (US); Yoichi Kawakami, Kusatsu (JP); Mitsuru Funato, Kyoto (JP); Shigeo Fujita, Kyoto (JP)

(73) Assignee: Nichia Corporation, Tokushima (JP)

( * ) Notice: Subject to any disclaimer, the term of this patent is extended or adjusted under 35 U.S.C. 154(b) by 0 days.

(21) Appl. No.: 10/314,444

(22) Filed: Dec. 9, 2002

(65) Prior Publication Data

US 2004/0108513 A1 Jun. 10, 2004

(51) Int. Cl.$^7$ ........................................... H01L 31/0328
(52) U.S. Cl. ...................... 257/183; 257/187; 257/200; 438/48; 438/60
(58) Field of Search ................................. 257/183, 187, 257/200, 9–27; 438/48, 60

(56) References Cited

U.S. PATENT DOCUMENTS 6,229,151 B1    5/2001    Takeuchi et al.

FOREIGN PATENT DOCUMENTS

JP    11-112029    4/1999

OTHER PUBLICATIONS

P. Waltereit et al., "Nitride semiconductors free of electrostatic fields for efficient white light–emitting diodes," letters to nature, NATURE, Aug. 24, 2000, vol. 406, pp. 865–868.

Primary Examiner—Fetsum Abraham
(74) Attorney, Agent, or Firm—Volentine Francos & Whitt PLLC

(57) ABSTRACT

The luminous efficiency of a nitride semiconductor device comprising a gallium nitride-based semiconductor layer formed on a dissimilar substrate is improved. An n-type layer formed on the substrate with a buffer layer interposed between them comprises a portion of recess-and-projection shape in section as viewed in the longitudinal direction. Active layers are formed on at least two side faces of the projection with the recess located between them. A p-type layer is formed within the recess. An insulating layer is formed on the top face of the projection, and on the bottom face of the recess. The n-type layer is provided with an n-electrode while the p-type layer is provided with a p-electrode contact layer. As viewed from the p-type layer formed within the recess in the gallium nitride-based semiconductor layer, the active layer and the n-type layer are located in an opposite relation to each other. As viewed from the side face of the recess, the active layer and the p-type layer are formed across the n-type layer.

34 Claims, 9 Drawing Sheets

US 6,876,009 B2

NITRIDE SEMICONDUCTOR DEVICE AND A PROCESS OF MANUFACTURING THE SAME

BACKGROUND OF THE INVENTION

1. Field of the Invention

The present invention relates generally to a nitride semiconductor device comprising a gallium nitride-based semiconductor layer and a process of manufacturing the same. A particular object of the present invention is to improve on the luminous efficiency of a nitride semiconductor light-emitting device comprising a gallium nitride-based semiconductor layer formed on a dissimilar substrate.

2. Related Art

In recent years, nitride semiconductor light-emitting devices comprising gallium nitride-based semiconductor layers have been put to practice use in a variety of fields and actually used in every aspect of daily life in the form of LEDs for emitting light in varying colors and at varying wavelengths such as blue light, green light, white light, and ultraviolet light. White LEDs in particular are a promising candidate for the coming generation of illumination devices that will take the position of fluorescent lamps. To achieve a nitride semi-conductor device with such properties as high efficiency and high luminance, however, there is still plenty of room for improvements.

In nitride semiconductor devices widely used so far in the art and comprising gallium nitride-based semiconductor layers, an n-type gallium nitride-based semiconductor layer, an active layer and a p-type gallium nitride-based semiconductor layer are stacked on the C-plane of a sapphire substrate. Why such nitride semiconductor devices have wide applications is that gallium nitride having satisfactory crystallographic properties is obtained because of relatively ready growth of gallium nitride on the C-plane of sapphire. For actual use of nitride semiconductor devices comprising such gallium nitride-based semiconductor layers, it is of importance that gallium nitride possess satisfactory crystallographic properties. The gallium nitride used to this end has a wurtzite crystal structure wherein the growth plane of gallium nitride is defined by the C-plane.

Referring generally to a nitride semiconductor quantum well prepared on a sapphire substrate, the well grows in the C-axis direction, and so large piezoelectric fields occur vertically within the growth plane. This in turn causes an emission energy level to be shifted toward a lower energy side as compared with the case of no electric field (quantum confined Stark effect) and electrons and holes to be spaced away from each other, offering problems such as drops of the probability of light emission and luminous efficiency.

To address such problems, JP-A 11-112029 discloses at pages 2–5 and illustrates in FIG. 9 an LED wherein for a device structure with reduced Stark effect on, for instance, gallium nitride, quantum wells are formed on the A-plane (2-1-10), M-plane (0-110) and R-plane (2-1-14) rather than on the C-plane (0001) of gallium nitride. P. Waltereit and seven others, "Nitride semiconductors free of electrostatic fields for efficient white light-emitting diodes, letters to nature", NATURE, Aug. 24, 2000, vol. 406, pp. 865–868 reports that a GaN/AlGaN quantum well structure formed on an $LiAlO_2$ (100) substrate grows in the M-axis direction and so can form a heterointerface with no electric field, whereby an emission peak energy is more enhanced than that of a sample on the C-axis, leading to an increase in the probability of radiative transition.

Since it is difficult to prepare high-quality $LiAlO_2$ (100) substrates, however, it is vitally important to develop technologies for the formation of M-plane active layers on sapphire substrates. In addition, if the M-plane or the A-plane can arbitrarily be formed, it is then possible to provide a high-density M-plane active layer, a high-density A-plane active layer or a high-density active layer on a combined M- and A-plane. This is now expected to play an important role in the achievement of light-emitting devices having enhanced efficiency and increased output.

Still, much is desired for the luminance of gallium nitride-based LEDs, and for the output of semiconductor laser diodes (LDs). Decreases in luminous efficiency due to quantum confined Stark effect are a not-to-be-missed problem, and reductions or elimination of this effect poses a challenge. Thus, the achievement of an unheard-of device structure having higher luminous efficiency and capable of superseding existing LEDs and LDs are in great demand. A primary object of the present invention is to provide a novel device structure having high luminous efficiency, in which the decreases in luminous efficiency due to the aforesaid Stark effect are reduced or eliminated.

SUMMARY OF THE INVENTION

The nitride semiconductor device of the present invention wherein quantum wells are formed on the M-plane or the A-plane, preferably the M-plane, is embodied as follows.

(1) A nitride semiconductor device, characterized by comprising a substrate, an n-type layer having a recess-and-projection portion, two side faces of a projection with a recess interposed therebetween and a p-type layer formed within the recess, wherein an active layer is interposed between each side face of the projection and a side face of a p-type layer opposite thereto.

(2) A nitride semiconductor device, characterized by comprising a substrate, an n-type layer stacked on the substrate and having a projection, and a p-type layer, wherein said p-type layer is formed active layers on at least a pair of opposite side faces, and a side face of the projection of said n-type layer is joined to an outside of each active layer.

(3) The nitride semiconductor device according to (2) above, characterized in that said n-type layer has a recess-and-projection portion, a p-type layer is formed within a recess, and an active layer and a p-type layer are interposed between side faces of the recess.

(4) The nitride semiconductor device according to (1) or (3), characterized in that said recess is provided on a bottom face thereof with an insulating film.

(5) The nitride semiconductor device according to (2) above, characterized in that said p-type layer is provided on a bottom face thereof with an insulating film.

(6) The nitride semiconductor device according to (3), wherein said p-type layer is provided on a bottom face thereof with an insulating film.

(7) The nitride semiconductor device according to (5) above, characterized in that a side face of said projection is defined by a surface vertical to a C-plane of a gallium nitride-based semiconductor layer.

(8) The nitride semiconductor device according to (7) above, wherein said surface vertical to the C-plane is an M-plane or an A-plane.

(9) The nitride semiconductor device according to (8) above, characterized in that a side face of said p-type layer is defined by the M-plane or A-plane of a gallium nitride-based semiconductor layer.

(10) The nitride semiconductor device according to claim 9, characterized in that said active layer comprises a plurality of continuous M-planes or A-planes, and a plurality of such active layers are provided.

(11) The nitride semiconductor device according to (10) above, characterized in that a junction interface between the active layer and the n-type layer, and between the active layer and the p-type layer has a piezoelectric field of substantially 0.

(12) The nitride semiconductor device according to (11) above, characterized in that said active layer comprises a single layer composed of $Al_xIn_yGa_{1-x-y}N$ where $0 \leq x$, $0 \leq y$ and $x+y<1$ or a plurality of such layers.

(13) The nitride semiconductor device according to (12) above, characterized in that the n-type layer is formed contiguously to a C-plane of a sapphire substrate.

(14) The nitride semiconductor device according to (13) above, characterized in that said n-type layer comprises a single layer composed of $Al_xIn_yGa_{1-x-y}N$ where $0 \leq x$, $0 \leq y$ and $x+y<1$ or a plurality of such layers.

(15) The nitride semiconductor device according to (14) above, characterized in that said p-type layer comprises a single layer composed of $Al_xIn_yGa_{1-x-y}N$ where $0 \leq x$, $0 \leq y$ and $x+y<1$ or a plurality of such layers.

(16) The nitride semiconductor device according to (15) above, characterized in that a p-contact layer is formed all over the topmost surface thereof.

(17) The nitride semiconductor device according to (16) above, characterized in that said M-plane or A-plane is further provided with an n-type gallium nitride-based semiconductor layer.

(18) The nitride semiconductor device according to any one of (7) to (17) above, characterized in that said active layer comprises a plurality of continuous M-planes or A-planes with a plane-to-plane angle of 30°, 60°, 90°, 120°, 150°, 210°, 240°, 270°, 300° or 330°, as viewed from an upper surface of the n-type layer having a recess-and-projection portion.

(19) The nitride semiconductor device according to any one of (7) to (17) above, characterized in that said active layer comprises an M-plane or an A-plane, and is formed in a striped pattern as viewed an upper surface of the n-type layer having a recess-and-projection portion.

(20) A process of manufacturing a nitride semiconductor device, characterized by comprising steps of:

(1) forming a n-type layer on a growth substrate, (2) providing said n-type layer with a recess-and-projection portion, (3) forming active layers on side faces of said projection, and (4) forming a p-type layer within a recess sandwiched between said active layers.

(21) The process of manufacturing a nitride semiconductor device according to (20) above, characterized in that in said step (1), a sapphire substrate whose major surface is defined by a C-plane is used as the growth substrate, so that an M-plane of a gallium nitride-based semiconductor layer is exposed vertically to said C-plane.

(22) The process of manufacturing a nitride semiconductor device according to (21) above, characterized in that in said step (2), said recess-and-projection portion is formed while a surface thereof vertical to the C-plane of the gallium nitride-based semiconductor layer is exposed.

(23) The process of manufacturing a nitride semiconductor device according to (22) above, characterized in that said surface vertical to the C-plane is an M-plane or an A-plane of the gallium nitride-based semiconductor layer.

(24) The process of manufacturing a nitride semiconductor device according to (23) above, characterized in that in said step (3), said active layers are formed while the M-plane or A-plane of the gallium nitride-based semiconductor layer is exposed.

(25) The process of manufacturing a nitride semiconductor device according to (24) above, characterized in that in said step (3), said active layers are formed by growth of $Al_xIn_yGa_{1-x-y}N$ where $0 \leq x$, $0 \leq y$ and $x+y<1$.

(26) The process of manufacturing a nitride semiconductor device according to (25) above, characterized in that in said step (3), the active layers are grown in a multiple quantum well form.

(27) The process of manufacturing a nitride semiconductor device according to (26) above, characterized in that in said step (1), the n-type layer is formed by growth of $Al_xIn_yGa_{1-x-y}N$ where $0 \leq x$, $0 \leq y$ and $x+y<1$.

(28) The process of manufacturing a nitride semiconductor device according to (27) above, characterized in that in said step (4), the p-type layer is formed by growth of $Al_xIn_yGa_{1-x-y}N$ where $0 \leq x$, $0 \leq y$ and $x+y<1$.

(29) The process of manufacturing a nitride semiconductor device according to (28) above, characterized in that in said step (2), the recess-and-projection portion is formed by etching of the n-type layer, with an insulating film being formed on a non-etching surface.

(30) The process of manufacturing a nitride semiconductor device according to (29) above, characterized in that for formation of the recess-and-projection portion in said step (2), the n-type layer is exposed by etching, and said insulating film is then formed on a top face of the projection and a bottom face of the recess.

(31) The process of manufacturing a nitride semiconductor device according to (30) above, characterized in that for formation of the n-type layer in said step (2), an n-type contact layer to come into ohmic contact with an n-electrode is formed.

(32) The process of manufacturing a nitride semiconductor device according to (31) above, characterized by comprising, in addition to said steps (1) to (4), an additional step (5) of forming a p-contact layer to come into ohmic contact with a p-electrode on the p-type layer formed within said recess.

(33) The process of manufacturing a nitride semiconductor device according to (32) above, characterized in that prior to formation of the n-type layer in said step (1), a buffer layer composed of a nitride semiconductor is formed said on the growth substrate.

(34) The process of manufacturing a nitride semiconductor device according to any one of (20) to (33) above, characterized in that prior to formation of the active layers in said step (3), $Al_xIn_yGa_{1-x-y}N$ where $0 \leq x$, $0 \leq y$ and $x+y<1$ is grown to form the n-type layer.

DETAILED EXPLANATION OF THE INVENTION

DETAILED EXPLANATION OF THE INVENTION 1.0 Overview of Nitride Semiconductor Device Some modes of carrying out the invention are now explained more specifically with reference to the accompanying drawings.

Figure 1:
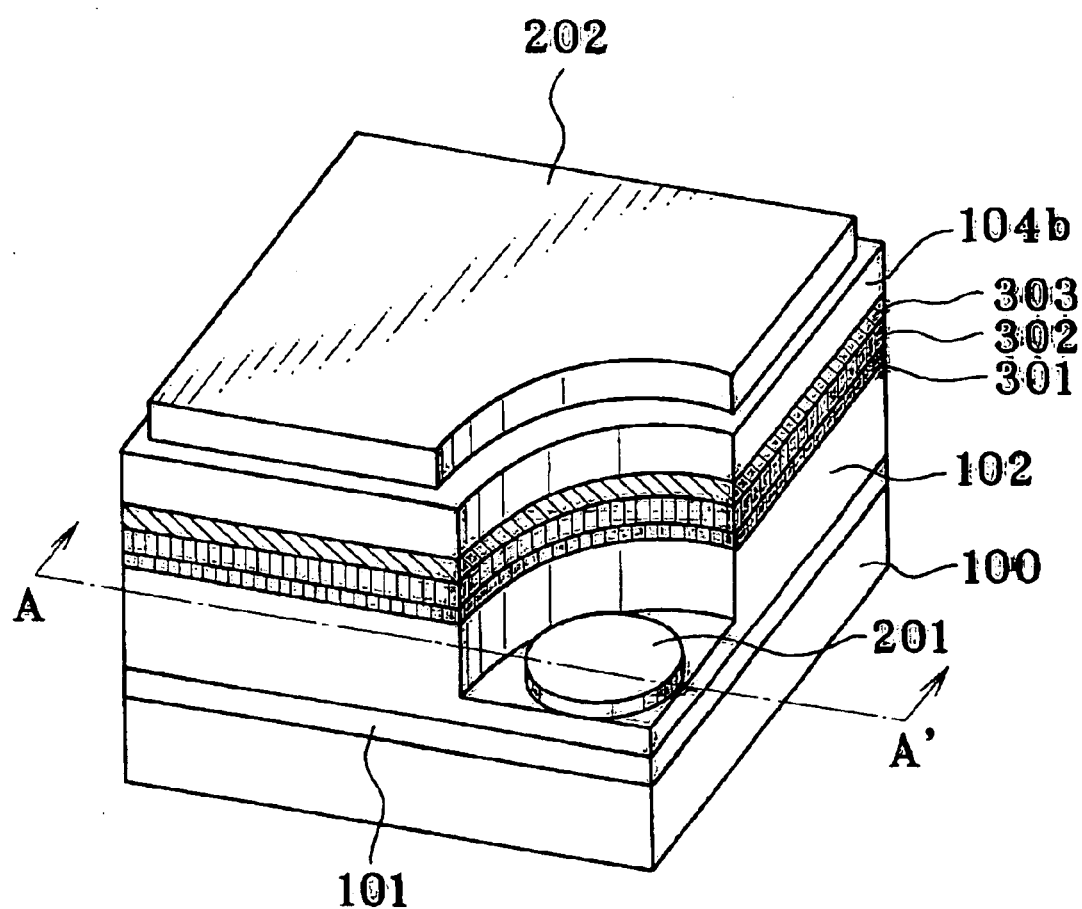
FIG. 1 is illustrative in schematic of one embodiment of the nitride semiconductor device according to the present invention.
Figure 2:
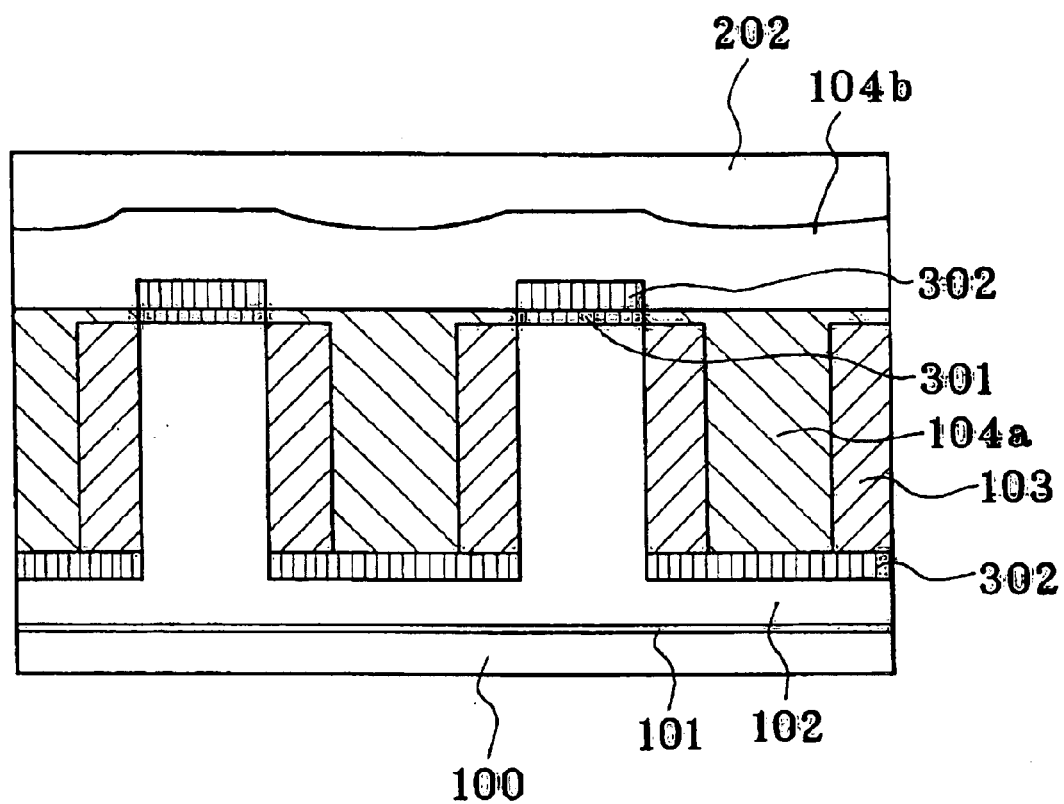
FIG. 2 is illustrative in schematic section of the nitride semiconductor device of the present invention, as cut away along a vertical plane of FIG. 1.
Figure 3:
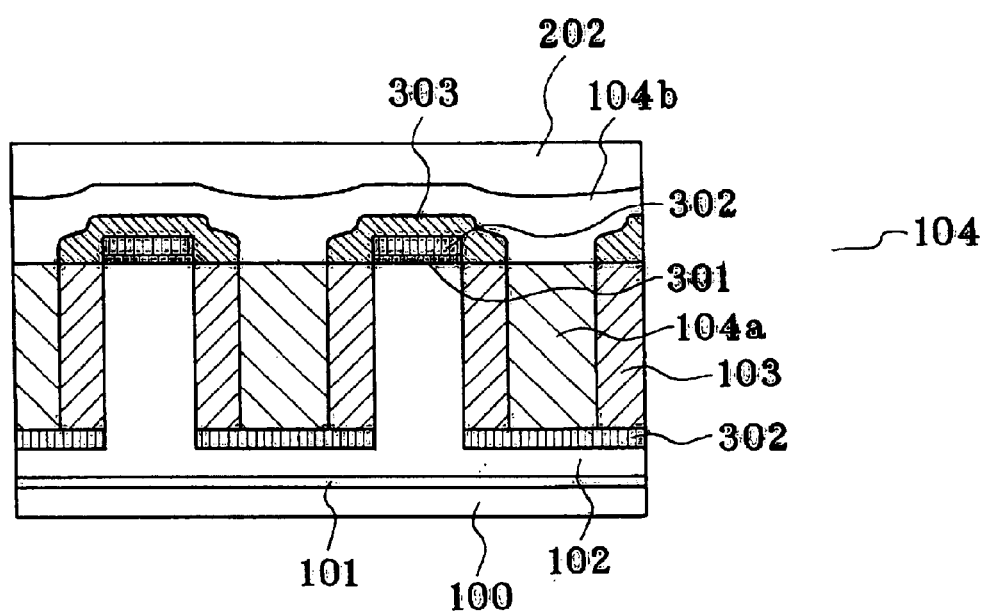
FIG. 3 is another schematic section of the nitride semiconductor of the present invention, as cut away along a vertical plane of FIG. 1.
Figure 4:
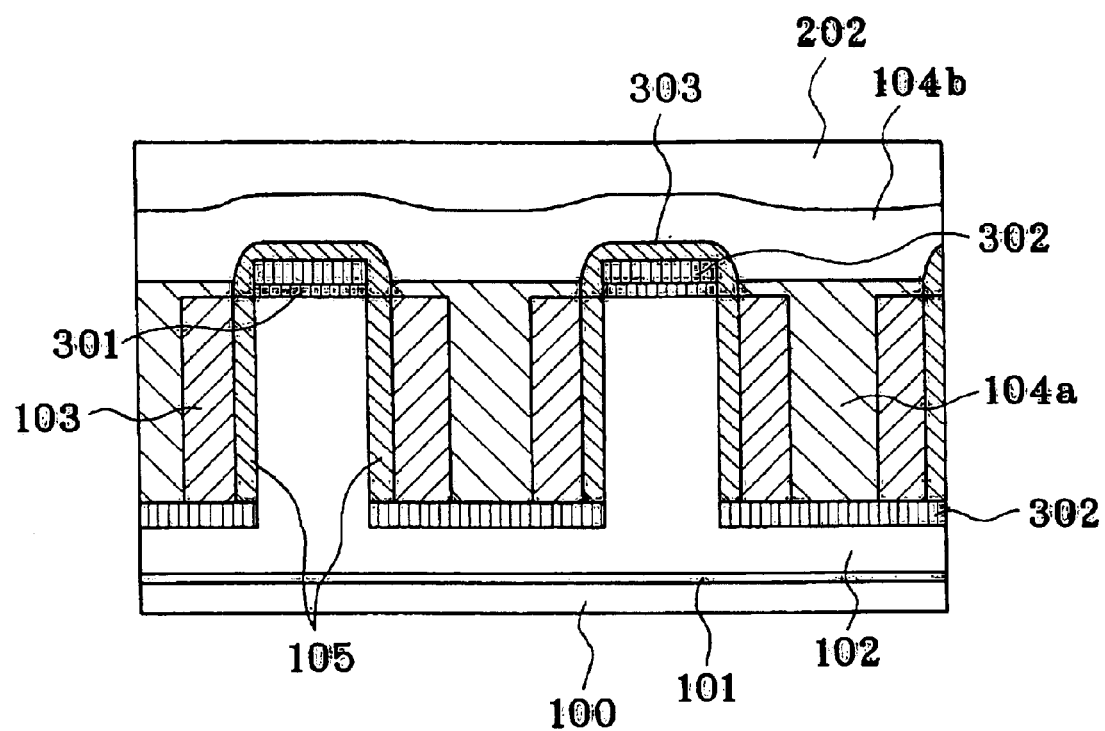
FIG. 4 is yet another schematic section of the nitride semiconductor of the present invention, as cut away along a vertical plane of FIG. 1.

As shown in FIGS. 1, 2, 3 and 4, an n-type gallium nitride semiconductor-based semiconductor layer (the first n-type layer) 102 having recess-and-projection portions is formed on a growth substrate 100 while a buffer layer composed of a gallium nitride-based semiconductor layer 101 is interposed between them. On the side face of the recess in the n-type gallium nitride-based semiconductor layer 102 there are formed an active layer 103 and a first p-type gallium nitride-based semiconductor layer 104a (the first p-type layer) in this order. The p-type gallium nitride-based semiconductor layer 104a is provided with active layers 103 on at least a pair of opposite side faces. Reference numerals 301 to 303 stand for insulating layers, 104b a second p-type gallium nitride layer (the second p-type layer), 201 an n-electrode and 202 a p-electrode. In the embodiment of FIG. 4, a second n-type nitride semiconductor layer 105 (the second n-type layer) is formed on the side face of the n-type gallium nitride-based semiconductor layer 102.

In this nitride semiconductor device, the active layer 103 comes into contact with the n-type layer 102 or the p-type layer 104a. In other words, the gallium nitride-based semiconductor device has a plurality of end faces dissimilar from two major heterojunction faces, wherein the end faces are directed to the upper surface of the device, so that full advantage is taken of the edge emission of the active layer.

The side face of the projection of the n-type layer 102 is defined by the M- or A-plane of the gallium nitride-based semiconductor layer and the side face of the p-type layer 104a is defined by the M- or A-plane of the gallium nitride-based semiconductor layer. When gallium nitride is grown on a sapphire or other hetero-substrate, it is impossible to grow a gallium nitride-based semiconductor layer whose major surface is defined by the M- or A-plane, or else if it is somehow grown, its crystallographic properties are very worse. For this reason, a sapphire substrate whose major surface is defined by the C-plane is used to grow gallium nitride. Then, the gallium nitride formed on the C-plane of sapphire is growing in the C-axis direction, giving the C-plane as the major surface.

Such a gallium nitride-based semiconductor layer whose major surface is defined by the C-plane has improved crystallographic properties. After the formation of the gallium nitride-based semiconductor layer whose major surface is defined by the C-plane, the gallium nitride-based semiconductor layer is etched such that its vertical plane (preferably the M- or A-plane of the gallium nitride-based semiconductor layer) is exposed, thereby to form a recess-and-projection portion and grow active layers on the side faces of the recess (the side faces of the projection). The then formed junction surface between the gallium nitride-based semiconductor layer and the active layer is defined by the M- or A-plane. When the active layer is formed in this way, the junction surface between the n-type gallium nitride-based semiconductor layer and the active layer is defined by the M- or A-plane of the gallium nitride-based semiconductor layer with a piezoelectric field of approximately zero. In other words, the junction interface substantially free from any electric field can be formed.

Following the formation of the active layer on the side face of the recess (the side face of the projection), the p-type gallium nitride-based semiconductor layer is further grown. When the junction surface between the active layer and the n-type layer is defined by the M-plane, the junction surface between the p-type gallium nitride-based semiconductor layer and the active layer, too, is defined by the M-plane. When the junction surface between the active layer and the n-type layer is defined by the A-plane, on the other hand, the junction surface between the p-type gallium nitride-based semiconductor layer and the active layer, too, is defined by the A-plane of the gallium nitride-based semiconductor layer. To put it another way, the junction surface between the p-type gallium nitride-based semiconductor layer and the active layer is defined by the M- or A-plane of the gallium nitride-based semiconductor layer. To sum up, both the interface between the active layer and the n-type layer and the interface between the active layer and the p-type layer are defined by the M-plane or the A-plane.

The present invention has also such advantages as mentioned below. In a conventional gallium nitride-based semiconductor layer device, a sapphire or other hetero-substrate is provided thereon with an active layer-containing gallium nitride-based semiconductor layer in the direction vertical to the substrate. For instance, the sapphire substrate is provided on its C-plane with a gallium nitride-based semiconductor layer in the C-axis direction alone of the gallium nitride-based semiconductor layer. A problem with this gallium nitride-based semiconductor device is that compression strain and tensile strain remain applied onto the junction surface between the respective layers due to a coefficient-of-thermal-expansion difference between the hetero-substrate and the gallium nitride-based semiconductor. These strains have some considerable influences on the active layer in particular, and so make the band gap of the active layer complicated and cause a number of crystal defects to occur in the active layer, resulting in a further drop of luminous efficiency.

According to the present invention wherein the active layer 103 is formed vertically to the growth substrate 100, however, it is unlikely that any large strain is imposed on the active layer. One reason why no large strain is placed on the active layer is that the active layer is formed vertically to the growth substrate. Another possible reason could be that the junction surface of a conventional active layer is joined directly to the C-plane of a gallium nitride-based semiconductor parallel with the major surface of a growth substrate, whereas the active layer of the present invention is not directly joined to the C-plane of the gallium nitride-based semiconductor; that is, the active layer is formed on the C-plane of the gallium nitride-based semiconductor with an insulating film interposed between them. It is thus possible to obtain a nitride semiconductor device in which strains ascribable to the coefficient of thermal expansion are more reduced than ever before and, hence, achieve a significant increase in the area of the device, which has been difficult with the prior art device.

According to the present invention, the junction surface of the active layer is located on the side face of the recess (the side face of the projection) in the n-type layer having a recess-and-projection portion, and the junction area of each junction surface is so small that the strain imposed on the junction surface becomes small. As the growth substrate becomes large, the strain imposed on the junction surface of a conventional active layer becomes increasingly large; however, the junction surface of the active layer according to the present invention is not directly affected whatsoever. It is thus possible to achieve a significant increase in the area of the device, which has been difficult with the prior art device.

In the present invention, the side face of the projection or recess of the n-type layer, i.e., the junction interface between the active layer and the n-type layer should preferably be defined by the M-plane or the A-plane. Given an off angle in the range of ±5° to 8°, however, that junction interface is governed by the M-plane so that the piezoelectric field comes close to substantially zero. Namely, although that junction surface is somewhat inferior to a junction surface defined by the true M- or A-plane, much the same effect is achievable with a decreasing piezoelectric field. If at least 80% of the side face of the n-type layer or the side face of the recess are defined by the M- or A-plane, that side face then defines a predominant junction interface and so much the same effect is achievable with respect to the decrease in the piezoelectric field although the properties are again somewhat inferior. This is also valid for the junction interface between the p-type layer and the active layer.

Regarding the junction surfaces between the active layer and the n-type layer-and between the p-type layer and the active layer, the following differences could be found between the M-plane and the A-plane. When each junction surface is defined by the M-plane, the M-plane is considered to behave as a very stable surface in a gallium nitride-based semiconductor layer. This is preferable in that crystal growth is so easily controllable that a surface of high flatness can be obtained and, hence, an active layer of improved crystallographic properties can be obtained. When the junction surface is defined by the A-plane, on the other hand, the A-plane grows more rapidly than does the M-plane in the gallium nitride-based semiconductor layer. This is favorable in view of productivity because an active layer can be obtained within a shorter time.

Most preferably in view of the object of the present invention, both the junction surface between the active layer and the n-type layer and the junction surface between the p-type layer and the active layer should be defined by the M-plane that ensures an active layer of improved crystallographic properties. In that case, the active layer is composed of a plurality of continuous M-planes wherein the plane-to-plane angle is 60°, 120°, 240° or 300° as viewed from the top surface of the n-type layer having a recess-and-projection portion. Alternatively, the active layer may be located in a striped pattern as viewed from the top surface of the n-type layer having an M-plane and a recess-and-projection portion.

2.0 Specific Construction of Nitride Semiconductor Device

A. Growth Substrate 100

For the growth substrate 100 on which gallium nitride is to grow, it is preferable to use sapphire. It is particularly preferable to use sapphire the major surface of which is defined by the C-plane, because a gallium nitride-based semiconductor layer of improved crystallographic properties can be formed. Further, when gallium nitride is grown on the C-plane of the sapphire substrate, the M- or A-plane can be exposed with relative ease in the process of fabrication because the M- or A-plane of gallium nitride to be exposed by etching provides a surface vertical to sapphire.

With the process of fabrication in mind, it is preferable to use sapphire wherein the major surface is defined by the C-plane and the orientation flat surface is defined by the A-plane. This is particularly true for the case where only or at least the M-plane of gallium nitride is exposed. The reason is that with reference to the A-plane of the orientation flat surface, the surface vertical to the orientation flat surface and vertical to the C-plane provides the M-plane of gallium nitride so that the M-plane of gallium nitride can easily be exposed. When only or at least the A-plane of gallium nitride is exposed, it is likewise preferable to use sapphire wherein the major surface is defined by the C-plane and the orientation flat surface is defined by the M-plane, because the A-plane of gallium nitride can again be easily exposed. More preferably in view of improved crystallographic properties, sapphire whose major surface is defined by an off-angled C-plane should be used for the growth substrate 100.

For the growth substrate 100 preferably used herein, the sapphire substrate whose major surface is defined by the C-plane has been explained; however, the present invention is not always limited thereto. Any desired substrate may be used for the gallium nitride-based semiconductor layer provided that the junction surface to the growth substrate is defined by the C-plane. Possible other growth substrate 100 material may include silicon carbide although the resulting properties are inferior to those of the sapphire substrate.

In the present invention, when the growth substrate 100 has insulating properties, it is acceptable to form a part or the whole of the gallium nitride-based semiconductor layer and thereafter strip off the growth substrate as by irradiation with laser or remove the growth substrate as by polishing, thereby forming a gallium nitride substrate. This gallium nitride substrate is characterized in that the major surface is defined by the C-plane. When gallium nitride is used as the substrate, a single layer of undoped or Si-doped gallium nitride having a thickness of at least 80 μm is needed. When the growth substrate is so removed that gallium nitride can be used as the substrate, one electrode is formed on the gallium nitride substrate. It is thus possible to obtain a gallium nitride-based semiconductor device wherein the n-electrode and p-electrode are located in an opposite direction and, hence, currents are likely to flow uniformly therethrough. It is also possible to reduce the size of the device.

B. N-type Layer 102 Having a Recess-and-Projection Portion

For the n-type layer 102, a single layer composed of $Al_xIn_yGa_{1-x-y}N$ (where $0 \leq x$, $0 \leq y$, and $x+y<1$) or a plurality of such layers are formed. For this n-type layer 102, it is preferable that the side face of the recess (the side face of the projection) is defined by the M- or A-plane of the gallium nitride-based semiconductor layer. More preferably, the bottom face of the recess and the top face of the projection should be defined by the C-plane of the gallium nitride-based semiconductor.

In the present invention, the n-type layer comprises at least a clad layer for transporting and confining carriers in the active layer. For this clad layer, an appropriate selection may be made from materials that are larger than the band gap of the active layer and ensure an ample offset between the clad layer and the active layer. When InGaN is used to form the active layer, the n-type layer functions well as a clad layer if it is formed of GaN or AlGaN.

The n-type layer 102 may further comprise an n-type contact layer that comes into good ohmic contact with the n-electrode. The n-type contact layer, because of being in contact with the electrode, should preferably be of low resistance. For the gallium nitride-based semiconductor, preference is given to GaN doped with Si as n-type impurities.

The n-type layer 102 having a recess-and-projection portion is formed by stacking a gallium nitride-based semiconductor layer on the substrate in the C-axis direction, and then etching the stack in such a way that the M- or A-plane of the gallium nitride-based semiconductor layer is exposed, thereby providing the n-type layer with a recess-and-projection portion.

Alternatively, an n-type layer having a recess-and-projection portion may be formed as a first n-type layer, followed by the formation of a recess-and-projection portion. Then, an n-type gallium nitride-based semiconductor layer may be formed as a second n-type layer on the M- or A-plane of the thus exposed surface. When the second n-type layer is provided, this layer may function as a clad layer in the case of a light-emitting diode (LED), and as a light guide layer in the case of a semiconductor laser diode (LD). The second n-type layer grown on the M- or A-plane may also function as a crystal recovery layer prior to the formation of the active layer. If this layer is formed on a rough surface by dry etching such as RIE (reactive ion etching), then the active layer can be formed with improved crystallographic properties. As the means for dry etching the aforesaid n-type gallium nitride-based semiconductor layer, it is acceptable to rely on CAIBE (chemically assisted ion beam).

The configuration of the aforesaid recess-and-projection portion will be explained with reference to FIGS. 5 to 8; however, it is understood that such a portion is not necessarily delineated by straight lines or formed in a linear shape. For instance, the recess-and-projection portion may be formed by etching the gallium nitride-based semiconductor layer in such a way that a columnar projection or recess is cut out. When the gallium nitride-based semiconductor layer is etched in such a way as to form a columnar projection therethrough and the active layer is grown on the side face of the columnar projection, the A- or M-plane is preferentially grown by virtue of the inherent nature of the gallium nitride-based semiconductor. The preferential plane is determined by a suitable choice of the deposition system for epitaxial growth of gallium nitride, the growth temperature, the III-to-V ratio, the growth pressure, etc.

The present invention is characterized in that planes vertical to the C-plane of gallium nitride are exposed on the side face of the aforesaid recess-and-projection portion of the gallium nitride-based semiconductor layer. All planes but the A- and M-planes of the gallium nitride-based semiconductor are unstable due to their high surface energy and so the aforesaid active layer is substantially unlikely to be formed thereon. Accordingly, the side face of the recess-and-projection portion may be defined by any desired plane vertical to the C-plane; however, it is noted that the gallium nitride-based semiconductor grown on the plane vertical to the C-plane is susceptible to growth on the A- or M-plane.

In this connection, the growth of an epitaxial growth layer on a plane vertical to the C-plane of the gallium nitride-based semiconductor layer has so far been attempted in the art. However, the feature of the present invention is that the active layer and the n-type layer are formed in opposite relations as viewed from the p-type GaN formed within the recess of the aforesaid gallium nitride-based semiconductor layer, and the active layer and the p-type GaN are formed therebetween as viewed from the side face of the recess in the n-type layer.

When the nitride semiconductor device is used as a light-emitting diode, if required, this layer may be allowed to function as a clad layer. When the nitride semiconductor device is used as a semiconductor laser diode, on the other hand, this layer may be permitted to function as a light guide function. If a plurality of layers are provided, then it is possible to impart a clad layer function to one layer and a light guide layer function to another. For the light guide layer, an appropriate selection may be made from materials that ensure that light is fully confined in the active layer.

Figure 5:
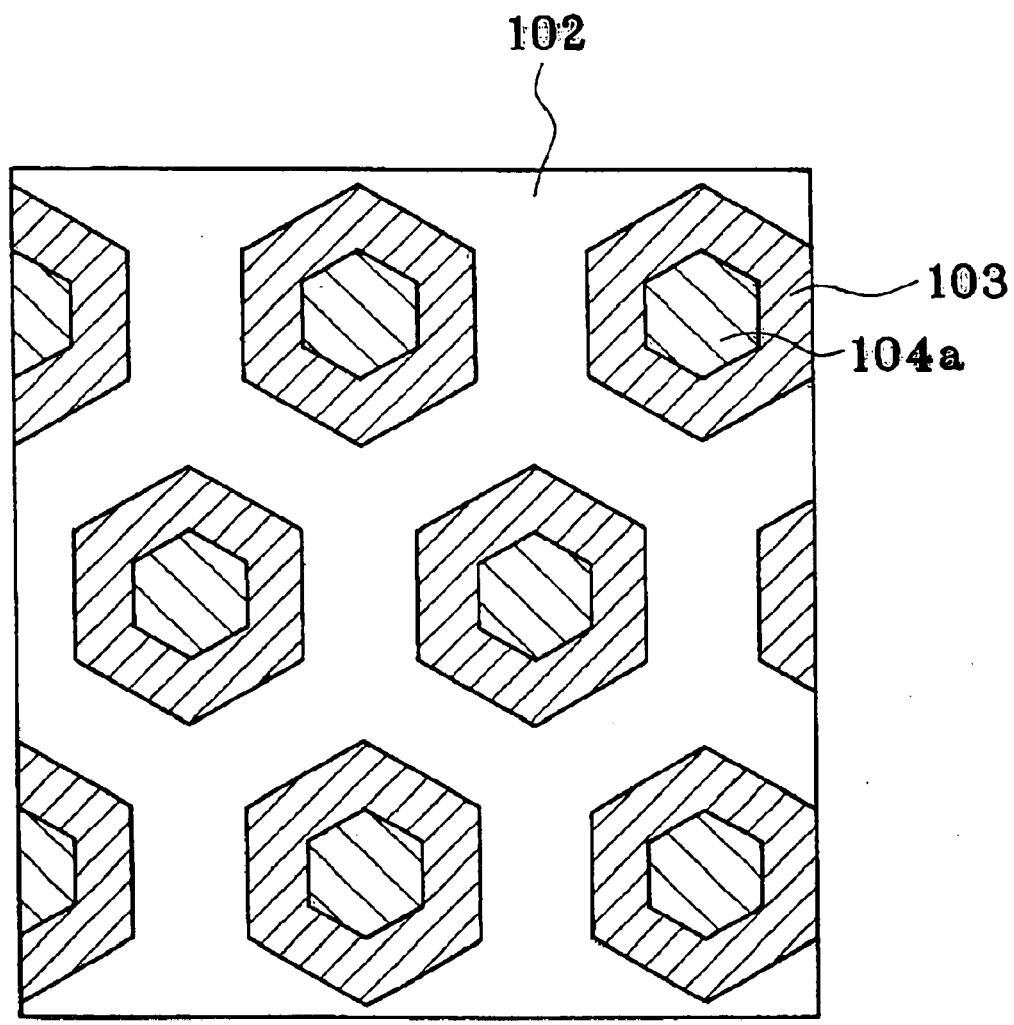
FIG. 5 is a schematic plan view of a part of the section taken on horizontal plane A–A' of FIG. 1, showing one embodiment of the nitride semiconductor device of the present invention.
Figure 6:
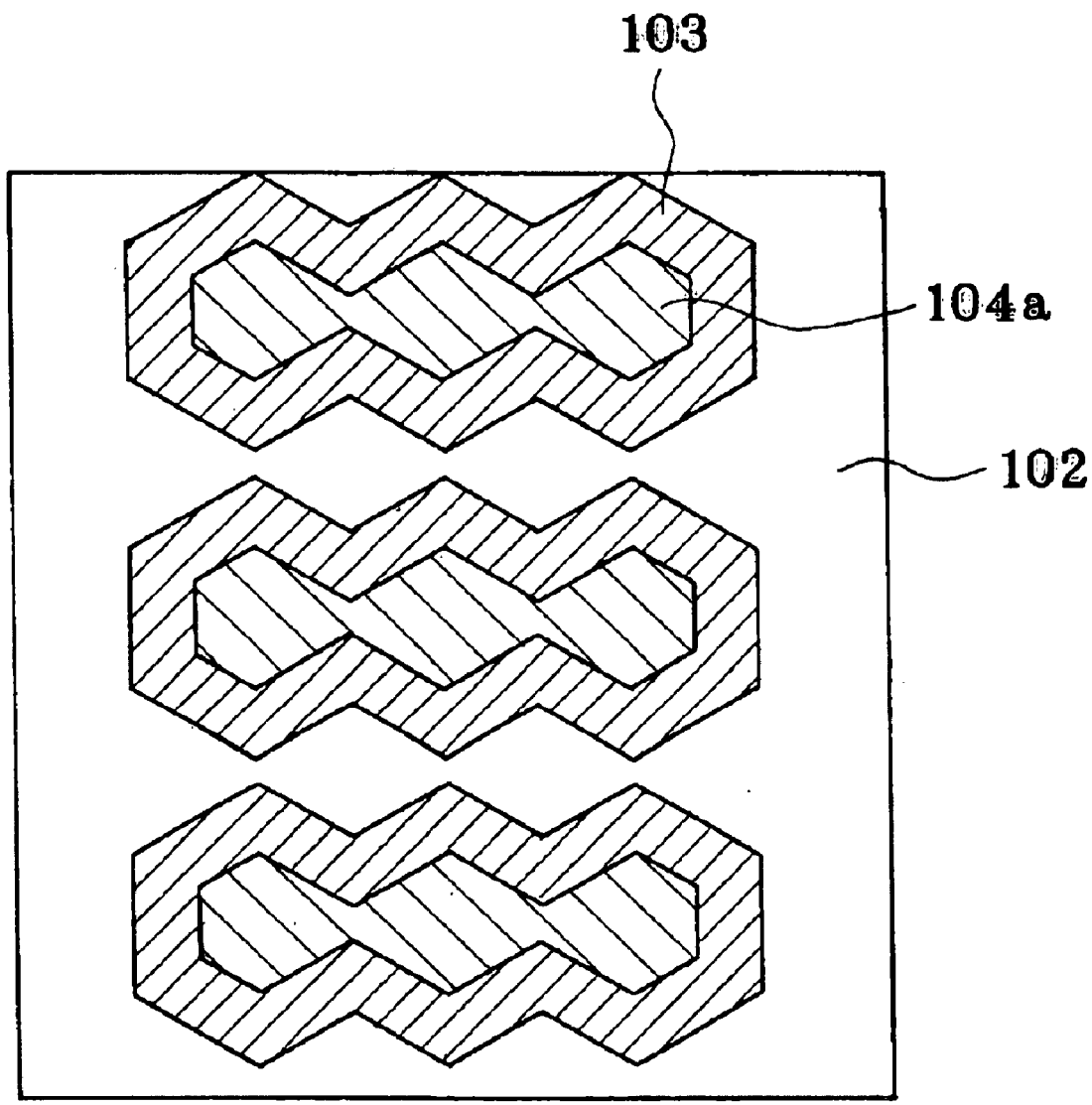
FIG. 6 is a schematic plan view of a part of the section taken on horizontal plane A–A' of FIG. 1, showing another embodiment of the nitride semiconductor device of the present invention.
Figure 7:
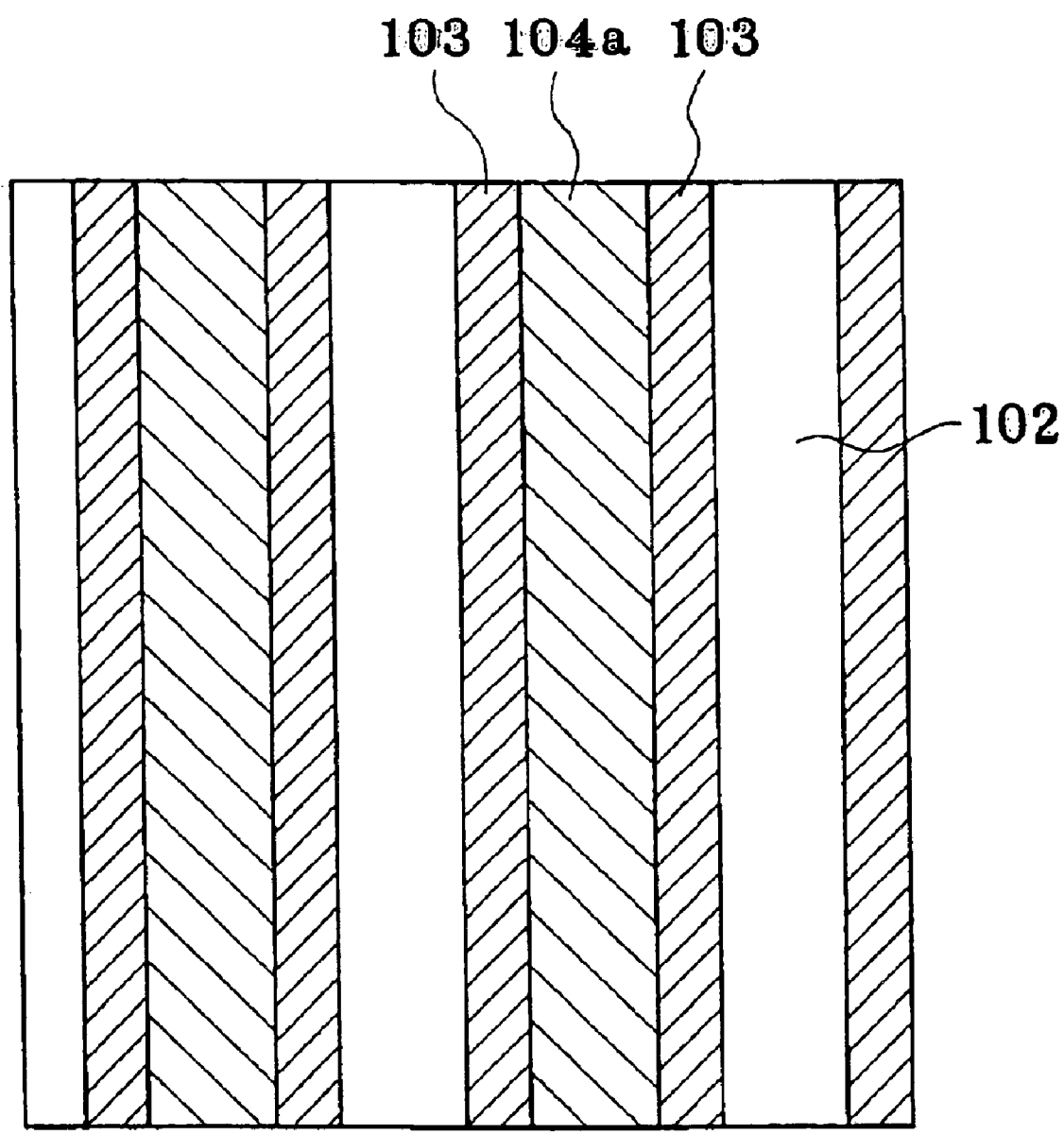
FIG. 7 is a schematic plan view of a part of the section taken on horizontal plane A–A' of FIG. 1, showing yet another embodiment of the nitride semiconductor device of the present invention.
Figure 8:
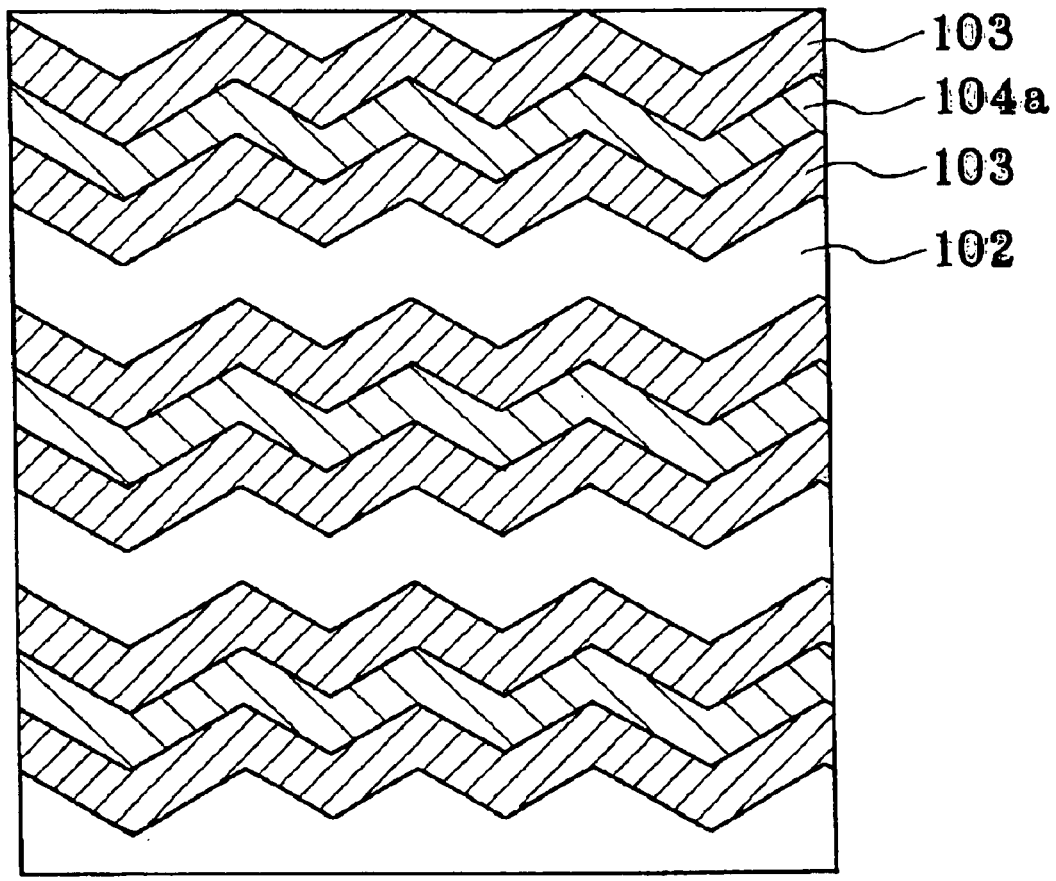
FIG. 8 is a schematic plan view of a part of the section taken on horizontal plane A–A' of FIG. 1, showing a further embodiment of the nitride semiconductor device of the present invention.

In the present invention, the recess-and-projection portion should be configured as shown in FIGS. 5 to 8, as viewed from the upper surface of the device, in such a way that the junction surface of the side face of the recess (the side face of the projection) to the active layer formed thereon is defined by the M- or A-plane. FIGS. 5 to 8 all show the junction surface between the n-type layer 102 and the active layer 103, i.e., the step of the recess-and-projection portion and the junction surface between the active layer 103 and the p-type layer 104. More specifically, FIG. 5 is illustrative in plan of a pattern of regular hexagonal recess-and-projection portions, FIG. 6 is illustrative of a modified pattern of FIG. 5, FIG. 7 is illustrative of recess-and-projection portions in a striped pattern, and FIG. 8 is illustrative of continuous recess-and-projection portions in a repetitively corrugated pattern at side face-to-side face angles of 120° and 240°.

FIGS. 5, 6 and 8 show an active layer comprising a plurality of continuous M-planes at a plane-to-plane angle of 120° or 240°. In the semiconductor device, a plurality of such active layers are provided. Alternatively, the active layer may be of a regular rectangular shape in plan. In the semiconductor device, a plurality of such active layers are provided. FIG. 7 shows a striped pattern of active layers. In this case, too, each active layer comprising a plurality of M-planes is formed. In any case, the junction surface corresponds to the M-plane of the gallium nitride-based semiconductor.

Figure 9:
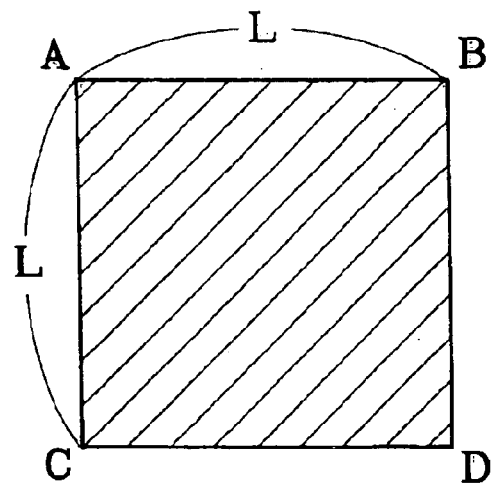
FIG. 9 is a plan view of the light-emitting surface of a conventional nitride semiconductor device.

With the nitride semiconductor device wherein, as contemplated herein, the n-type layer is provided with a recess-and-projection portion and an active layer is formed on the side face of the projection of the recess-and-projection portion, the quantity of emitted light can be larger than could be achieved in the prior art. The reason is now explained with reference to the plan views of FIGS. 9 and 10. FIG. 9 is illustrative of a conventional nitride semiconductor device capable of plane light emission. For the sake of simplification, assume here that a hatched light-emitting surface is defined by a rectangle ABDC wherein the lengths L of the respective sides AB (=CD) and AC (=BD) are equal. In this case, the area of the light-emitting surface is given by $L \times L = L^2$.

Figure 10:
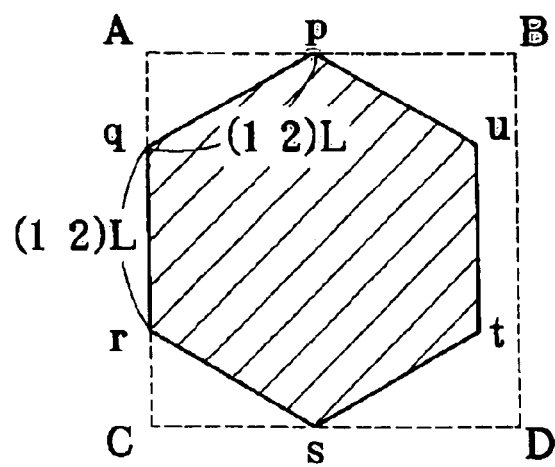
FIG. 10 is a plan view of the light-emitting surface of the nitride semiconductor device of the present invention.

FIG. 10 is illustrative of one embodiment of the active layer according to the present invention. Assume here that the shape of the active layer formed on the side face of the projection of the aforesaid recess-and-projection portion is a regular hexagon. Suppose now that the hexagon pqrstu is located in the aforesaid rectangle ABDC. Given pq=qr=(½) L, then the length Lx of the total circumference of the regular hexagon pqrstu is given by Lx=6×(½)L=3L. Here let $\underline{d}$ be the depth of the recess. Then, the light-emitting area of the active layer of the nitride semiconductor device configured as shown in FIG. 10 is given by d×Lx=3dL. If L=$\mu$m and d=1 $\mu$m, the light-emitting area of FIG. 10 is three times as large as that of FIG. 9. According to one embodiment of the present invention, it is thus found that given the same plane area, the quantity of light emitted from the nitride semiconductor device is three times as large as that achieved so far in the art.

Although some embodiments as viewed in plan of the recess-and-projection portion are shown in FIGS. 5 to 8, it is understood that the recess-and-projection portion may have other configurations. Although not illustrated, all the side faces of the recess (the side faces of the projection) may be configured to A-planes in a repetitive, continuous corrugated pattern at side face-to-side face angles of 120° and 240° or in a continuous regular rectangular shape at a side face-to-side face angle of 60°. Alternatively, all the side faces of the recess (the side faces of the projection) may be configured to M- or A-planes in a continuous, repetitive corrugated pattern at a side face-to-side face angle of 30°, 60°, 90°, 120°, 150°, 210°, 240°, 270°, 300° or 330°.

So long as all the side faces of the recess (the side faces of the projection) are configured to the M- or A-planes, no particular limitation is placed on the configuration of the recess-and-projection portion. As shown in FIG. 5 in particular, the present invention may also be applicable to a modified regular hexagon configuration wherein, if the side face-to-side face angle is 120°, all the side faces of the recess (the side faces of the projection) are configured to M-planes or A-planes.

Referring further to the n-type layer having a recess-and-projection portion according to the present invention, after the formation of the recess-and-projection portion, an insulating film 302 is formed on the bottom face of the recess, and on the top face of the projection so that the junction surface of the n-type layer to the active layer is defined by the M-plane of the gallium nitride-based semiconductor. This in turn makes it possible to obtain a device wherein the n-type layer and the active layer are joined together only at the M-plane of the gallium nitride-based semiconductor. The "insulating film" used herein is understood to refer to a film having insulating properties. Such an insulating film may be formed of $SiO_2$, $ZrO_2$ or the like material, with $SiO_2$ being preferred. $SiO_2$ is used as a preferable protective film upon etching of a gallium nitride-based semiconductor by RIE or the like.

C. Active Layer 103

For the active layer, a single layer composed of $Al_xIn_yGa_{1-x-y}N$ (where $0\leq x$, $0\leq y$, and x+y<1) or a plurality of such layers are formed. In this active layer, a part of N may have been replaced by B, P, As or the like. The active layer may form either a single heterojunction or a double heterojunction. Further, either a single quantum well structure or a multiple quantum well structure may be formed as the quantum well structure. The multiple quantum well structure wherein well layers and barrier layers are repetitively stacked one upon another is preferable to obtain LEDs or LDs having such properties as high efficiency, high luminance and high output.

D. N-Type Layer 104

For the p-type layer 104, a single layer composed of $Al_xIn_yGa_{1-x-y}N$ (where $0\leq x$, $0\leq y$, and x+y<1) and doped with Mg as p-type impurities or a plurality of such layers are formed. This p-type layer is formed in such a way that a recess formed by the n-type layer and the active layer is completely buried up; in other words, the topmost surface of the p-type layer is located at a position that is at least flush with, or higher than, the topmost surfaces of the n-type layer and the active layer. Preferably, the topmost surface of the p-type layer is located at the position that is flush with the topmost surfaces of the n-type layer and the active layer. In the present invention, the p-type layer 104 is connected to the n-type layer with the active layer interposed between them, because the insulating film 302 is formed on the bottom face of the recess, and on the top face of the projection of the n-type layer having a recess-and-projection portion.

For the p-type layer 104 in the present invention, it is acceptable that the first p-type layer 104a is formed by a layer that is buried up in the recess and the second p-type layer 104b is formed all over the topmost surface of the device. For the second p-type layer 104b, it is acceptable to form a p-type contact layer in good ohmic contact with at least the p-electrode 202. This second p-type layer 104b is composed of a single layer composed of $Al_xIn_yGa_{1-x-y}N$ (where $0\leq x$, $0\leq y$, and x+y<1) and doped with Mg as p-type impurities or a plurality of such layers, and formed all over the upper surface of the gallium nitride semiconductor device, and so the p-electrode is easily formed thereon. Such a double-layer structure is favorable in that the present gallium nitride-based semiconductor device has the same appearance as that of a conventional gallium nitride semiconductor device; the present gallium nitride-based semiconductor device can easily be achieved by adding a bit of modification to an existing gallium nitride-based semiconductor device.

The second p-type layer is preferable in that by decreasing its thickness, it is possible to achieve a gallium nitride-based semiconductor device having high light extraction efficiency because the absorption of light emitted from the end face of the active layer by that device can be reduced. Conversely, when that thickness is increased, the surface of the gallium nitride-based semiconductor device is made so flat that its close contact with the p-electrode is improved. If the second p-type layer is grown on the C-plane of the first p-type layer, it is then possible to grow gallium nitride of good crystallographic properties and, hence, achieve good ohmic properties with the p-electrode. When the second p-type layer is not formed, it is acceptable that after the formation of the first p-type layer, the p-electrode is formed all over the upper surface of the gallium nitride-based semiconductor device.

E. Other Layers

Besides, the n-type layer, and the p-type layer may be made up of a plurality of layers, and a layer having another function, e.g., a crystal recovery layer may be interposed between the adjacent layers of the n-type layer, the active layer, the p-type layer and the p-type contact layer. In the embodiment of FIG. 4, the second n-type layer indicated by numeral 105 functions as a crystallographic property recovery layer, as will be described later. By interposing the second n-type layer between the side face of the first n-type layer and the active layer, it is possible to repair a surface roughening of the side face occurring upon etching of the first n-type layer 102 for the purpose of forming the recess-and-projection portion and degradation of crystals due to damage upon processing. When the nitride semiconductor of the present invention is applied to a light-emitting diode (LED), possible layers having the aforesaid another function include a carrier confinement layer, a light confinement layer, and a crystallographic property protecting layer for protecting the underlying crystal layer.

In the present invention, the n-type layer is provided with the n-electrode while the p-type layer is provided with the p-electrode. Regarding material and thickness, such electrodes should be selected in such a way as to come in satisfactory ohmic contact with the gallium nitride-based semiconductor layer. No particular limitation is imposed on the configuration of the p-electrode in particular, provided that it can be in satisfactory ohmic contact with the gallium nitride-based semiconductor layer.

The nitride semiconductor device of the present invention has various applications. If the gallium nitride-based semiconductor device is coated on its surface with a coating layer containing a fluorescent substance capable of absorbing a part or the whole of light emitted from $Al_xIn_yGa_{1-x-y}N$ (where $0 \leq x$, $0 \leq y$, and $x+y<1$) in the active layer and giving out light having varying wavelengths, then that device can emit light having varying wavelengths. By allowing the gallium nitride-based semiconductor device to contain YAG in particular, that device can be used as an illumination light source capable of giving out white light. The gallium nitride-based semiconductor device of the present invention is particularly effective for the illumination light source that must have an increased light emission area, because the strains imposed on the active layer can be kept small.

3.0 Process of Manufacturing a Nitride Semiconductor Device

The nitride semiconductor device of the present invention is now explained with reference to its manufacturing process that corresponds mainly to the schematic representation of FIG. 3.

(1) The n-type layer 102 is formed on the sapphire substrate 100. Prior to the formation of the n-type layer, the buffer layer 101 composed of a gallium nitride-based semiconductor is formed on the sapphire substrate 100 at a low temperature of 800° C. or lower. After the formation of the buffer layer 101, $Al_xIn_yGa_{1-x-y}N$ (where $0 \leq x$, $0 \leq y$, and $x+y<1$) is grown thereon to form a gallium nitride layer of improved crystallographic properties as the n-type layer.

(2) After the formation of the n-type layer 102, the first insulating film 301 formed typically of $SiO_2$ is formed as a protective film on a non-etching surface, using a mask such that the M-plane of the gallium nitride-based semiconductor is exposed. Subsequently, the n-type layer 102 is etched by RIE to form a recess-and-projection portion. Since the area of the side face of the projection corresponds to the junction area of a pn-junction, the etching depth should be equal to or greater than at least the growth thickness of the second insulating film, and preferably in the range where satisfactory light emission is obtainable or, in numerical parlance, at least 10 nm.

Irrespective of the presence of the first insulating film, it is necessary to use the second insulating film having a thickness of a few nm to about 10 nm for the purpose of obtaining a reliable insulating film with high productivity. The mask should be configured in such a striped pattern, a regular hexagonal pattern or a modified regular hexagonal pattern as shown in FIGS. 5 to 8, as viewed from above. Alternatively, the mask may be configured in a corrugated pattern at a side face-to-side face angle of 30°, 60°, 90°, 120°, 150°, 210°, 240°, 270°, 300°, or 330°.

(3) After the n-type layer 102 has been provided with the recess-and-projection portion, at least the recess is provided with the second insulating film 302 while the first insulating film 301 remains coated on the top of the projection. Alternatively, the second insulating film 302 composed of $SiO_2$ is formed on the bottom face of the recess and on the top face of the projection while the first insulating film 301 remains coated on the top of the projection. Then, $Al_xIn_yGa_{1-x-y}N$ (where $0 \leq x$, $0 \leq y$, and $x+y<1$) is grown in the form of the active layer 103. Prior to the growth of the active layer 103, it is acceptable to form an n-type layer composed of $Al_xIn_yGa_{1-x-y}N$ (where $0 \leq x$, $0 \leq y$, and $x+y<1$) in the form of a crystallographic property recovery layer or a clad layer or a light guide layer.

(4) The active layer 103 should preferably be grown in the form of a multiple quantum well wherein barrier layers and well layers are preferably repeatedly stacked one upon another.

(5) After the growth of the active layer 103, the p-type layer 104 is formed. It is noted, however, that when the p-type layer is formed on the end face of the active layer, no satisfactory pn-junction is obtained at the M- or A-plane. For this reason, for instance, $SiO_2$ is formed as the third insulating film 303 on a non-etching surface of the active layer, using a mask such that only the M-plane of the gallium nitride-based semiconductor is exposed.

(6) After $SiO_2$ has been formed as the third insulating film 303, $Al_xIn_yGa_{1-x-y}N$ (where $0 \leq x$, $0<y$, and $x+y<1$) doped with Mg as p-type impurities is grown in such a way that at least the recess in the n-type layer 102 is fully buried up. The second insulating film 302 formed on the bottom face of the recess in the n-type layer 102 is positioned on the bottom face of the p-type layer 104a in the embodiment of FIG. 2, and FIG. 4.

(7) Here it is acceptable to form the p-type layer 104a with no formation of the third insulating film 303 as shown in another embodiment of FIG. 2. In this case, the p-type layer 104a is formed not only on the M- or A-plane of the active layer 103 but also on the end face of the active layer 103. Even when the p-type layer 104a is grown with no formation of the insulating film 303 on the end face of the active layer 103, the proportion of the area of contact of the active layer 103 with the p-type layer 104 occupied by the area of the end face is considerably low. From this, it is found that in case a current flows through the end face, the amount of that current is generally not very large. Therefore, the advantages of the present invention are achievable even in the absence of the third insulating film 303. FIG. 4 is illustrative in schematic of yet another embodiment of the present invention. In the embodiment of FIG. 4, after the formation of the first n-type layer 102, the second n-type layer 105 is formed on the side face of the first n-type layer 102. Then, the third insulating film 303 is formed in such a way as to cover the end face of the second n-type layer 105. When the nitride semiconductor device of the present invention is used as a light-emitting diode (LED), the second n-type layer 105 functions as a clad layer, and when used as a semiconductor laser diode (LD), that layer 105 functions as a light guide layer. When the second n-type layer 105 is formed, the active layer 103 is formed after the formation of the second n-type layer 105. In the embodiment of FIG. 4, too, the p-type layer 104a is formed not only on the M- or A-plane of the active layer 103 but also on the end face of the active layer 103, as is the case with the embodiment of FIG. 2.

(8) In the gallium nitride-based semiconductor device wherein the recesses in the n-type layer 102 are all buried up, it is acceptable to form the second p-type layer 104b on the top-surface of the nitride semiconductor device while the p-type layer in the recess is used as the first p-type layer. To obtain good ohmic contact with the p-electrode, it is preferable to form a p-type contact layer as the second p-type layer 104b on the topmost surface. It is then preferable to use Mg-doped GaN as the p-type contact layer because it is of low resistance and can grow with satisfactory crystallographic properties.

(9) After formed, these p-type layers are annealed at 600° C. or higher, thereby ensuring satisfactory p-type. The p-electrode 202 and n-electrode 201 used herein are provided at least contiguously to the semiconductor layer, and so are appropriately formed of material showing good ohmic properties with respect to the adjoining semiconductor layer.

4. EXAMPLES

By way of example but not by way of limitation, the present invention is now explained with reference to Examples 1 and 2.

A. Example 1

A buffer layer composed of AlGaN is formed at a low temperature of 800° C. or lower on a sapphire substrate whose major surface is defined by the C-plane and whose orientation flat surface is defined by the A-plane. After the formation of the buffer layer, GaN is grown as an n-type layer, thereby obtaining a gallium nitride layer with satisfactory crystallographic properties. Then, $SiO_2$ is formed as an insulating film on a non-etching surface of the n-type layer using a mask such that the M-plane of the gallium nitride-based semiconductor is exposed. Then, the n-type layer is etched by RIE to form a recess-and-projection portion. Such recess-and-projection portions are formed on the n-type layer in a repetitive, continuous pattern as shown in FIG. 2.

After the formation of the recess-and-projection portions on the n-type layer, at least the recess or both the recess and the projection are provided with a second insulating film composed of $SiO_2$ as a protective film while the insulating film remains applied on the top portion of the projection. Following the formation of the second insulating film, a clad layer composed of AlGaN is formed, successively followed by the formation of an active layer having a multiple quantum well structure wherein well layers and barrier layers are made up of InGaN/GaN combinations. The outermost layer of the active layer may be formed of either a barrier or a well.

After the growth of the active layer, a third insulating film composed of $SiO_2$ is formed in such a way that only the M-plane of the gallium nitride-based semiconductor is exposed, whereby the junction interface between the active layer and the p-type layer is defined only by the M-plane of the gallium nitride-based semiconductor. It is noted that the third insulating film may be dispensed with. After the formation of $SiO_2$ as the third insulating film, AlGaN doped with Mg as p-type impurities is grown. This layer is formed in such a way that the recess in the n-type layer is fully buried up.

In the gallium nitride-based semiconductor device with the recesses being all bruied up, Mg-doped GaN is formed as a second p-type layer on the top surface of the nitride semiconductor device after the formation of the p-type layer in the recesses. After the formation of the second p-type layer, this layer is annealed at a temperature of 600° C. or higher thereby to obtain a p-type layer of low resistance. Then, a light-transmitting p-electrode is formed all over the surface of the second p-type layer, and an n-electrode is formed on the n-type layer. To be specific, the n-electrode is formed on a site of the n-type layer at which no recess-and-projection portion is provided. While that site is extended as far as the p-type layer, etching is carried out to form an n-side ohmic electrode. In this way, it is possible to obtain a gallium nitride-based semiconductor light-emitting device having enhanced luminous efficiency.

B. Example 2

As in Example 1, a gallium nitride-based semiconductor light-emitting device with the n- and p-electrodes mounted thereon is prepared ahead. By forming a mixture of a YAG-containing fluorescent substance with a resin on the surface of the light-emitting device, a white light-emitting device having enhanced luminous efficiency is obtained. By a choice of suitable fluorescent substance, it is possible to obtain a light-emitting device having varying light-emitting wavelengths and enhanced luminous efficiency. All these light-emitting devices, because their chip size can be increased, may be used as illumination substitutes for fluorescent lamps.

According to the inventive nitride semiconductor device comprising a gallium nitride-based semiconductor layer, and especially the inventive nitride semiconductor light-emitting device comprising a gallium nitride-based semiconductor layer formed on a hetero-substrate, it is possible to achieve a device having enhanced light emission device.

What we claim is:

1. A nitride semiconductor device, which comprises a substrate, an n-type layer having a recess-and-projection portion, two side faces of a projection with a recess interposed therebetween and a p-type layer formed within the recess, wherein an active layer is interposed between each side face of the projection and a side face of a p-type layer opposite thereto.

2. A nitride semiconductor device, comprising:
   a substrate having an upper surface;
   an n-type layer having a lower surface formed on the upper surface of the substrate and having an upper surface, wherein the upper surface of the n-type layer comprises a recessed upper surface portion and a sidewall extending upwardly from the recessed upper surface portion;
   a p-type layer formed on the recessed upper surface portion of said n-type layer and spaced from the sidewall of said n-type layer; and
   an active layer formed on the recessed upper surface portion of said n-type layer and interposed between said p-type layer and the sidewall of the n-type layer.

3. The nitride semiconductor device according to claim 2, wherein said sidewall surrounds said active layer, and wherein said active layer surrounds said p-type layer.

4. The nitride semiconductor device according to claim 1 or 3, wherein said recess is provided on a bottom face thereof with an insulating film.

5. The nitride semiconductor device according to claim 2, wherein said p-type layer is provided on a bottom face thereof with an insulating film.

6. The nitride semiconductor device according to claim 3, wherein said p-type layer is provided on a bottom face thereof with an insulating film.

7. The nitride semiconductor device according to claim 5, wherein a side face of said projection is defined by a surface vertical to a C-plane of a gallium nitride-based semiconductor layer.

8. The nitride semiconductor device according to claim 7, wherein said surface vertical to the C-plane is an M-plane or an A-plane.

9. The nitride semiconductor device according to claim 8, wherein a side face of said p-type layer is defined by the M-plane or A-plane of a gallium nitride-based semiconductor layer.

10. The nitride semiconductor device according to claim 9, wherein said active layer comprises a plurality of continuous M-plans or A-planes, and a plurality of such active layers are provided.

11. The nitride semiconductor device according to claim 10, wherein a junction interface between the active layer and the n-type layer, and between the active layer and the p-type layer has a piezoelectric filed of substantially 0.

12. The nitride semiconductor device according to claim 11, wherein said active layer comprises a single layer composed of $Al_xIn_yGa_{1-x-y}N$ where $0 \leqq x$, $0 \leqq y$ and $x+y<1$ or a plurality of such layers.

13. The nitride semiconductor device according to claim 12, wherein the n-type layer is formed contiguously to a C-plane of a sapphire substrate.

14. The nitride semiconductor device according to claim 13, wherein said n-type layer comprises a single layer composed of $Al_xIn_yGa_{1-x-y}N$ where $0 \leqq x$, $0 \leqq y$ and $x+y<1$ or a plurality of such layers.

15. The nitride semiconductor device according to claim 14, wherein said p-type layer comprises a single layer composed of $Al_xIn_yGa_{1-x-y}N$ where $0 \leqq x$, $0 \leqq y$ and $x+y<1$ or a plurality of such layers.

16. The nitride semiconductor device according to claim 15, wherein a p-contact layer is formed all over the topmost surface thereof.

17. The nitride semiconductor device according to claim 16, wherein said M-plane or A-plane is further provided with an n-type gallium nitride-based semiconductor layer.

18. The nitride semiconductor device according to any one of claims 7 to 17, wherein said active layer comprises a plurality of continuous M-planes or A-planes with a plane-to-plane angle of 30°, 60°, 90°, 120°, 150°, 210°, 240°, 270°, 300° or 330°, as viewed from an upper surface of the n-type layer having a recess-and-projection portion.

19. The nitride semiconductor device according to any one of claims 7 to 17, wherein said active layer comprises an M-plane or an A-plane, and is formed in a striped pattern as viewed an upper surface of the n-type layer having a recess-and-projection portion.

20. A process of manufacturing a nitride semiconductor device, comprising steps of:
 (1) forming a n-type layer on a grown substrate,
 (2) providing said n-type layer with a recess-and-projection portion,
 (3) forming active layers on side faces of said projection, and
 (4) forming a p-type layer within a recess sandwiched between said active layers.

21. The process of manufacturing a nitride semiconductor device according to claim 20, wherein in said step (1), a sapphire substrate whose major surface is defined by a C-plane is used as the growth substrate, so that an M-plane of a gallium nitride-based-semiconductor layer is exposed vertically to said C-plane.

22. The process of manufacturing a nitride semiconductor device according to claim 21, wherein in step (2), said recess-and-projection portion is formed while a surface thereof vertical to the C-plane of the gallium nitride-based semiconductor layer is exposed.

23. The process of manufacturing a nitride semiconductor device according to claim 22, wherein said surface vertical to the C-plane is an M-plane or an A-plane of the gallium nitride-based semiconductor layer.

24. The process of manufacturing a nitride-semiconductor device according to claim 23, wherein in said step (3), said active layers are formed while the M-plane or A-plane of the gallium nitride-based semiconductor layer is exposed.

25. The process of manufacturing a nitride semiconductor device according to claim 24, wherein in said step (3), said active layers are formed by growth of $Al_xIn_yGa_{1-x-y}N$ where $0 \leqq x$, $0 \leqq y$ and $x+y<1$.

26. The process of manufacturing a nitride-semiconductor device according to claim 25, wherein in said step (30, the active layers are grown in a multiple quantum well form.

27. The process of manufacturing a nitride-semiconductor device according to claim 26, wherein in said step (1), the n-type layer is formed by growth of $Al_xIn_yGa_{1-x-y}N$ where $0 \leqq x$, $0 \leqq y$ and $x+y<1$.

28. The process of manufacturing a nitride-semiconductor device according to claim 27, wherein in said step (4), the p-type layer is formed by growth of $Al_xIn_yGa_{1-x-y}N$ where $0 \leqq x$, $0 \leqq y$ and $x+y<1$.

29. The process of manufacturing a nitride-semiconductor device according to claim 28, wherein in said step (2), the recess-and-rejection portion is formed by etching of the n-type layer, with an insulating film being formed on a non-etching surface.

30. The process of manufacturing a nitride semiconductor device according to claim 29, wherein for formation of the recess-and-projection portion in said step (2), the n-type layer is exposed by etching, and said insulating film is then formed on a top face of the projection and a bottom face of the recess.

31. The process of manufacturing a nitride semiconductor device according to claim 30, wherein for formation of the n-type layer in step (2), an n-type contact layer to come into ohmic contact with an n-electrode is formed.

32. The process of manufacturing a nitride semiconductor device according to claim 31, which comprises, in addition to said steps (1) to (4), an additional step (5) of forming a p-contact layer to come into ohmic contact with a p-electrode on the p-type layer formed within said recess.

33. The process of manufacturing a nitride semiconductor device according to claim 32, wherein prior to formation of the n-type layer in said step (1), a buffer layer composed of a nitride semiconductor is formed said on the growth substrate.

34. The process of manufacturing a nitride semiconductor device according to any one of claims 20 to 33, wherein prior to formation of the active layers in said step (3), $Al_xIn_yGa_{1-x-y}N$ where $0 \leqq x$, $0 \leqq y$ and $x+y<1$ is grown to form the n-type layer.

* * * * *

UNITED STATES PATENT AND TRADEMARK OFFICE
CERTIFICATE OF CORRECTION

PATENT NO.       : 6,876,009 B2
APPLICATION NO.  : 10/314444
DATED            : April 5, 2005
INVENTOR(S)      : Yukio Narukawa et al.

It is certified that error appears in the above-identified patent and that said Letters Patent is hereby corrected as shown below:

Title Pg, item (73) (Assignee), add the following:

Yoichi Kawakami, Shiga (JP)
    Mitsuru Funato, Kyoto (JP)
    Shigeo Fujita, Kyoto (JP)
    California Institute of Technology, Pasadena, California (US)

Signed and Sealed this

Eighteenth Day of November, 2008

JON W. DUDAS
*Director of the United States Patent and Trademark Office*